United States Patent [19]

Sutphin, Jr.

[11] Patent Number: 4,518,936

[45] Date of Patent: May 21, 1985

[54] COMMUTATING FILTER PASSING ONLY THE FUNDAMENTAL FREQUENCY AND ODD HARMONICS THEREOF

[75] Inventor: Eldon M. Sutphin, Jr., Hillsboro Township, Hancock County, N.H.

[73] Assignee: RCA Corporation, Princeton, N.J.

[21] Appl. No.: 551,587

[22] Filed: Nov. 14, 1983

[51] Int. Cl.³ .................. H03H 19/00; H03H 11/04
[52] U.S. Cl. ........................... 333/173; 307/353; 328/151; 333/172; 333/174
[58] Field of Search ............... 333/167, 172–176; 328/151, 165, 167; 307/353, 520–523; 330/9; 364/725

[56] References Cited

U.S. PATENT DOCUMENTS 3,758,884  9/1973  Bahler et al. .
3,904,978  9/1975  Daniels et al. ............... 328/167 X
4,290,034  9/1981  Fraser, Jr. et al. ............ 333/173
4,331,894  5/1982  Gregorian et al. ............ 307/520

Primary Examiner—Marvin L. Nussbaum
Attorney, Agent, or Firm—Joseph S. Tripoli; Robert L. Troike; Raymond E. Smiley

[57] ABSTRACT

A commutating filter circuit producing only the fundamental frequency and odd harmonics of an input signal comprises first and second commutating filters each connected to receive the input signal and coupled to pass an output signal to the non-inverting and inverting terminals, respectively, of a differential amplifier. The first filter comprises N stages, each having a time constant of RC and a filter sampling frequency of $f_1$. The second filter comprises N/2 stages, each having a time constant of 2RC and a filter sampling frequency of $2f_1$. The resultant signal from the differential amplifier contains only the fundamental frequencies and odd harmonics of the input signal.

5 Claims, 3 Drawing Figures

COMMUTATING FILTER PASSING ONLY THE FUNDAMENTAL FREQUENCY AND ODD HARMONICS THEREOF

This invention is concerned with a commutating filter and more particularly with a commutating filter which rejects the d.c. component and even harmonics of a fundamental frequency presented thereto.

BACKGROUND OF THE INVENTION

Conventional commutating filters, when operated at a proper commutating frequency, pass not only the fundamental frequency but also the d.c. component thereof and all harmonics thereof. It is often desirable that the filter reject the d.c. component and sometimes desirable that the filter reject even harmonics of a fundamental frequency presented thereto. This desirability lacking in conventional commutating filters is offset by the fact that, relative to conventional filters, a commutating filter has the desirable characteristics of being a very high Q filter, preserving the input waveform, being easily tuned and being of compact size in that it requires no chokes.

SUMMARY OF THE INVENTION

In accordance with a preferred embodiment of the present invention a commutating filter is disclosed which passes only the fundamental frequency and odd harmonics thereof. The inventive commutating filter comprises a filter input terminal, a filter output terminal, a first commutating filter coupled to receive a signal of frequency $f_1$ from the filter input terminal and comprising N storage stages each having a time constant RC and having a first filter output terminal at which is presented an output signal, a second commutating filter also coupled to receive the frequency $f_1$ from the filter input terminal and comprising N/2 storage stages each having a time constant 2RC and having a second filter output terminal at which is presented an output signal, means to sample the storage stages of the first and second filters at speeds $f_1$ and $2f_1$, respectively, and a means having an output terminal coupled to the filter output terminal, having first and second input terminals coupled to the first filter output terminal and second filter output terminal respectively for subtractively combining the signals from the filter.

DETAILED DESCRIPTION

Figure 1:
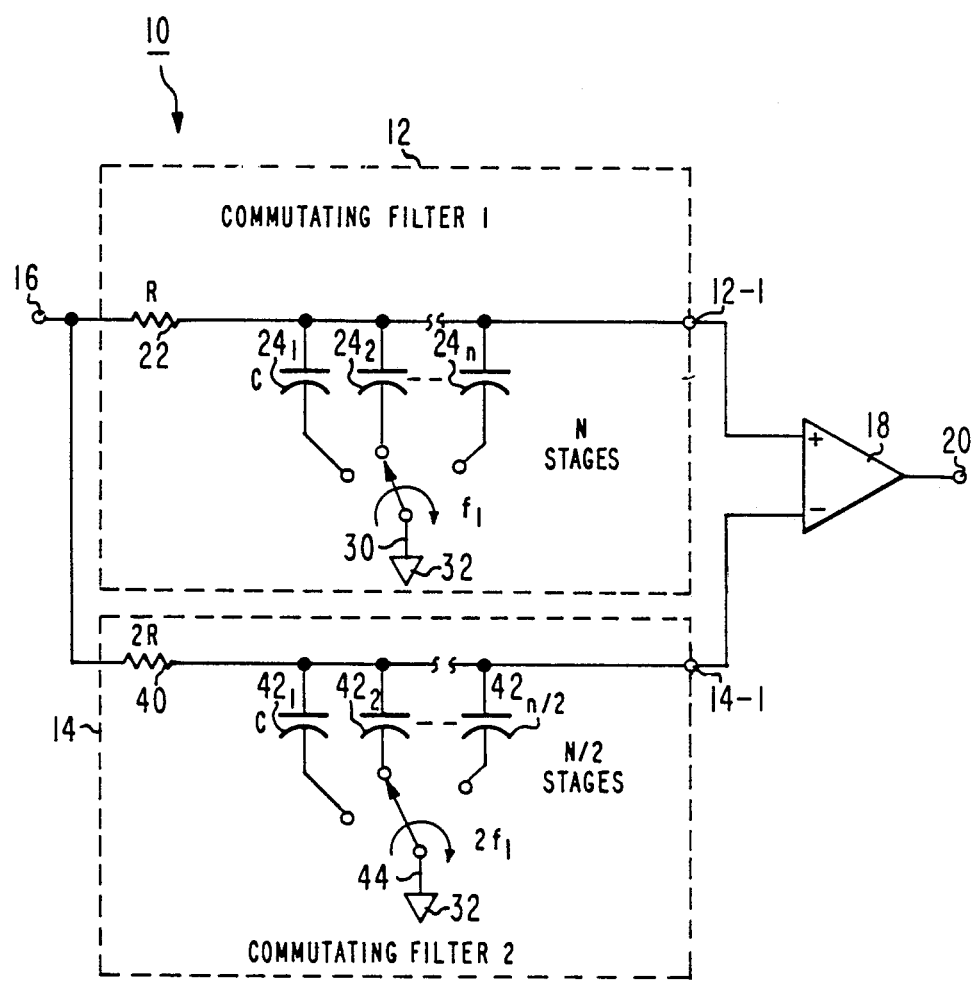
FIG. 1 is a commutating filter in electrical schematic form in accordance with a preferred embodiment of the present invention.

With respect to FIG. 1 the inventive commutating filter 10 is comprised of two commutating filter sections, commutating filter 1 within dashed block 12 and commutating filter 2 within dashed block 14, each connected to a common filter input terminal 16 and to respectively the non-inverting (+) terminal and inverting (−) inputs of a differential amplifier 18 which is in turn connected to filter output terminal 20. Filter section 1 is an N stage filter totally conventional in nature comprising a common resistor 22 of resistance value R connected between filter input terminal 16 and one side of a plurality N of signal storing capacitors each of capacitance value C, three numbered $24_1$, $24_2$ and $24_n$ (where n is equal in value to the value of N) being illustrated, and to the output of the commutating filter at terminal 12-1. The opposite ends of the N capacitors are connected to N terminals of a single-pole, N-throw switch 30 which in turn is connected to circuit ground 32. By means not shown, switch 30 is caused to rotate with a frequency of revolution of $f_1$. It will be understood that in reality an electronic switch would substitute for mechanical switch 30.

Figure 2:
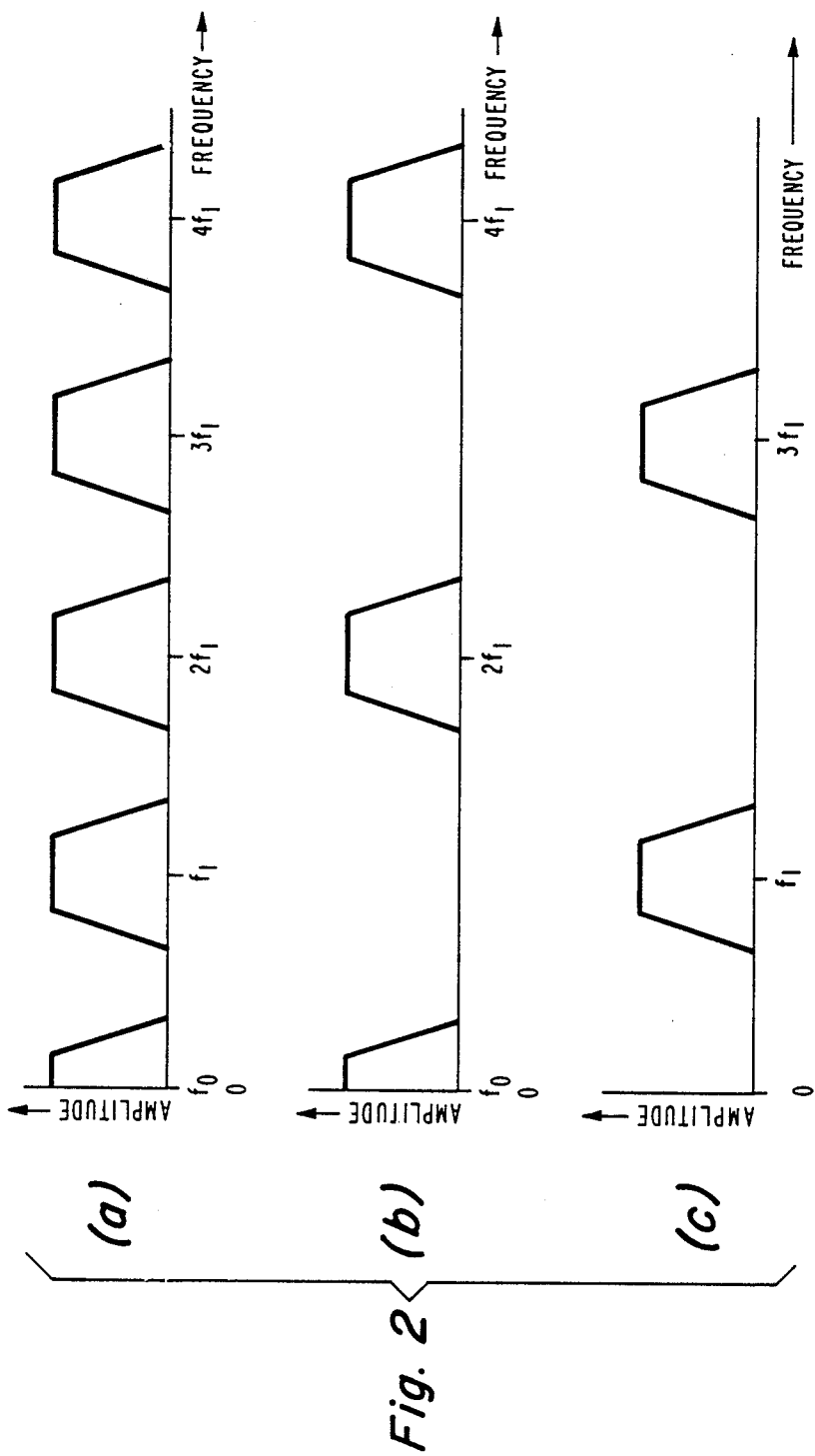
FIG. 2 is a set of frequency spectra useful in connection with an explanation of the operation of the FIG. 1 commutating filter.

With reference to FIG. 2 waveform (a), commutating filter 1 upon reception of an input frequency $f_1$ and when operating at a frequency of revolution of $f_1$ produces the spectrum illustrated in FIG. 2(a) which is illustrated with amplitude on the vertical axis and frequency on the horizontal axis. That is, the signal contains bands of frequencies about frequency $f_1$ and its even harmonics ($2f_1$, $4f_1$, etc.) and odd harmonics ($3f_1$, etc.) as well as a band of frequencies denoted $f_0$ at and above d.c. The $-3$ dB, cutoff frequency for each band of frequencies is $\pm 1/(2NRC)$ where N is the number of stages or capacitors in FIG. 1, R is the value of resistor in FIG. 1 and C is the value of each capacitor. Thus, as the number of stages the value of R or the value of C increases, the bandwidth narrows and therefore the filter Q increases.

Commutating filter 1 is a conventional commutating filter. In accordance with the invention a second N/2 stage commutating filter, commutating filter 2, within dashed block 14 is added. Commutating filter 2 comprises a resistor 40 of value 2R, that is twice the value of resistor 22, coupled between input terminal 16 and commutating output terminal 14-1 and N/2 capacitors of capacitance value C. Three, $42_1$, $42_2$ and $42_{n/2}$ (where n is equal in value to the value of N) are illustrated. It will be understood that N is the number of capacitors in commutating filter 1. In accordance with the teachings of the invention, the time constant (product of the resistance value and capacitance value) in commutating filter 2 is equal to twice the time constant (product of the resistance value and capacitance value) in commutating filter 1. Therefore alternatively, for example, resistor 22 and resistor 40 may be of the same value and each of capacitors 42 may be twice the value of each of capacitors 24, i.e., 2C.

The opposite sides of capacitors $42_1$ . . . $42_{n/2}$ are connected to respective terminals of to a single-pole, N/2-throw switch 44 which is connected to circuit ground 32. Switch 44 is caused (by means not shown of conventional design) to cycle through its half as many capacitors at $2 f_1$, that is at a cycling rate which is twice as fast as switch 30 of commutating filter 1 is rotating.

Output terminal 12-1 of commutating filter 1 is connected to the non-inverting (+) terminal of differential amplifier 18 while output terminal 14-1 of commutating filter 2 is connected to the inverting (−) terminal of differential amplifier 18. Its output terminal is connected to filter output terminal 20. It will be understood that the connections between the commutating filters and the input terminals of differential amplifier 18 could be reversed, that is, output terminal 12-1 could be connected to the inverting (−) terminal of amplifier 18 while the output terminal 14-1 of commutating filter 2 could be connected to the non-inverting (+) terminal of amplifier 18. With this arrangement FIG. 2 spectrum (c) to be discussed hereinafter would be of opposite polarity to that shown.

The output of commutating filter 2 at terminal 14-1 is as illustrated in FIG. 2 spectrum (b) where an input frequency $f_1$ at terminal 16 is assumed. As with spectrum 2(a) the vertical axis represents amplitude and the horizontal axis represents frequency. In accordance with spectrum 2(b) all odd harmonics including the fundamental frequency $f_1$ thereof are suppressed. The even harmonics $2f_1$, $4f_1$ . . . are passed by commutating filter 2 as is the d.c. component about frequency $f_0$.

Spectrum 2(c) illustrates the resultant output from differential amplifier 18 and is the result of subtracting spectrum 2(b) from spectrum 2(a). That is, the d.c. component and all even harmonics are removed leaving only the fundamental frequency $f_1$ and odd harmonics thereof as exemplified by frequency $3f_1$.

Figure 3:
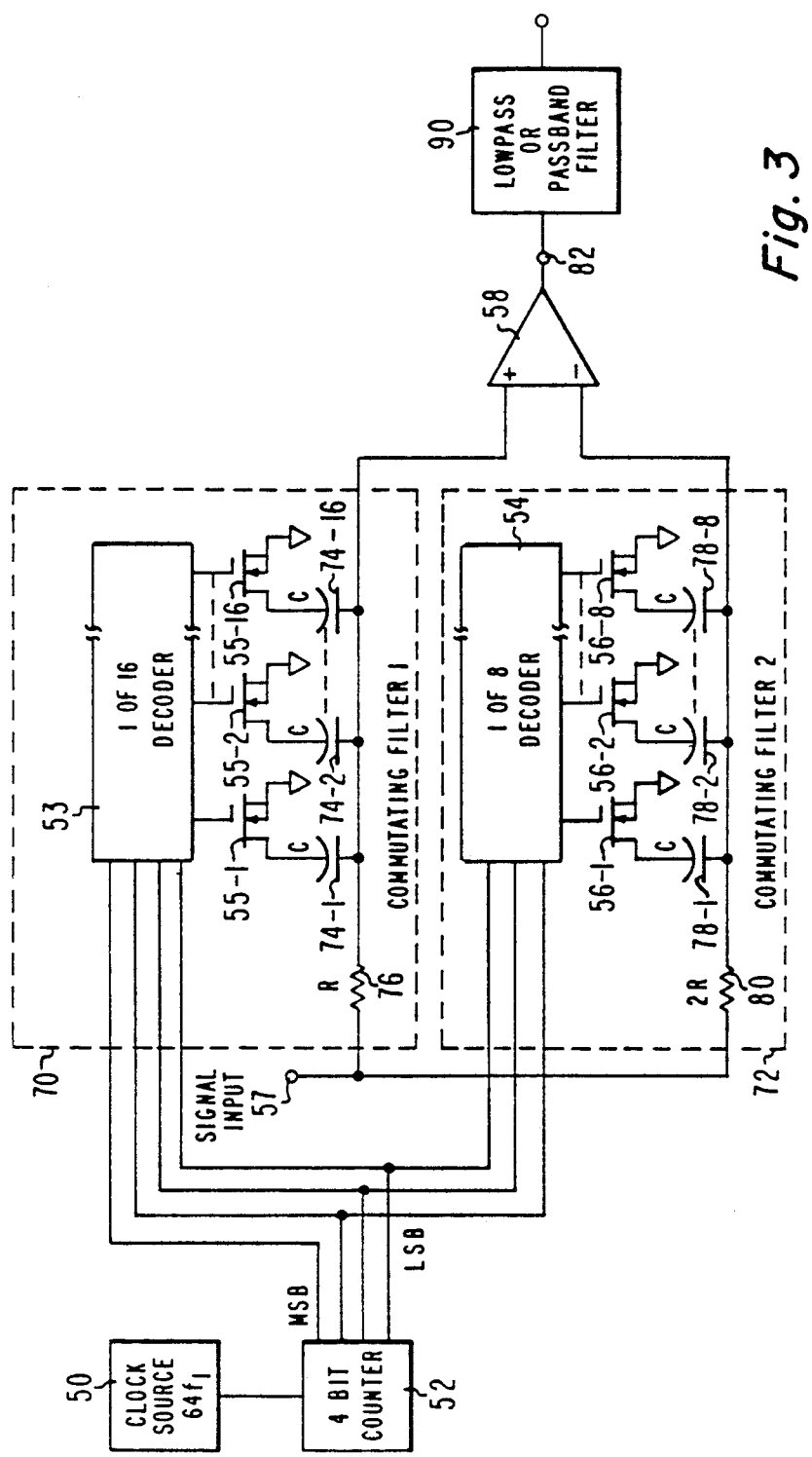
FIG. 3 is a commutating filter in electrical block schematic form in accordance with a preferred embodiment of the present invention.

FIG. 3 to which attention is now directed illustrates a practical commutating filter in accordance with the present invention. A clock source 50 produces periodic pulses at a multiple of $f_1$. If the frequency of the input signal can vary, then the clock source 50 must be able to produce pulses at a varying frequency. The multiple could be 2 (remembering that commutating filter 2 operates at a frequency $2f_1$) but in the example shown (for practical reasons) the multiple is 64 times the signal input frequency $f_1$.

Source 50 is connected to a binary counter of value appropriate to the multiple chosen for clock source 50. A 4-bit binary counter 52 is illustrated as an example. All four output bits from binary counter 52 are connected to a one-of-sixteen decoder 53 and the three least significant bits are connected to a one-of-eight decoder 54. Decoder 53 is part of a commutating filter 1 illustrated within dashed block 70 and equivalent to commutating filter 1 of FIG. 1 while decoder 54 is part of a commutating filter 2 illustrated within a dashed block 72 and equivalent to commutating filter 2 in FIG. 1.

The sixteen outputs of decoder 53 are connected to respective control electrodes of sixteen identical VMOS transistor switches, three, 55-1, 55-2 and 55-16, being illustrated. Decoder 53 and switches 55 are the equivalent of switch 30 in FIG. 1. The conductive path of each VMOS transistor switch is connected between circuit ground and one terminal of a capacitor, three capacitors 74-1, 74-2, and 74-16 being illustrated. Each of the capacitors is of capacitance value C. The other terminal of each of capacitors 74-1, 74-2 . . . 74-16 is connected to a resistor 76 of value R and to the non-inverting (+) terminal of a differential amplifier 58.

Similarly, the eight outputs of decoder 54 are connected to respective control electrodes of eight VMOS transistor switches, three of which 56-1, 56-2 and 56-8 are illustrated. Transistor switches 56 and decoder 54 are the equivalent of switch 44 in FIG. 1. The conductive paths of the transistor switches are connected between circuit ground and one terminal of respective capacitors, three, 78-1, 78-2, and 78-8, being illustrated. Each of the capacitors is of value C which is identical to the value of the capacitors in commutating filter 1. The other terminal of all the eight capacitors are connected in common to a resistor 80 of value 2R and to the inverting (−) terminal of differential amplifier 58. The juncture of resistors 76 and 80 is connected to signal input terminal 57 equivalent to input terminal 16 of FIG. 1. The output terminal 82 of differential amplifier 58 corresponds to the output terminal 20 in FIG. 1.

Operation of the filter of FIG. 3 is as follows. It is assumed that an input signal of frequency $f_1$ is applied at input terminal 57 and that clock source 50 is operating at a frequency $64 f_1$. Therefore, one of sixteen decoder 53 sequentially energizes transistor switches 55-1, 55-2 . . . 55-16, 55-1 . . . at a rate such that all sixteen transistors are energized during the time of one cycle of input frequency $f_1$. An exemplary input frequency $f_1$ is 30 KH$_3$. Therefore, an exemplary cycle period to sample all sixteen capacitors is 1/30 KH$_z$ or 33 microseconds. The resulting output signal as it appears at the (+) terminal of differential amplifier 58 is as illustrated in FIG. 2, waveform (a), that is a waveform containing both a band of frequencies at $f_1$ and odd and even harmonics thereof and a band of frequencies at d.c. An exemplary value of R is 10K ohms. An exemplary value of C is 0.1 microfarads. Therefore, remembering that the −3 dB cutoff point is $\pm 1/(2NRC)$ the −3 dB cutoff points of the band are $\pm 31.25$ Hz $= \pm 1/(2 \cdot 16 \cdot 10K$ ohms $\times 0.1$ microfarads).

Similarly and concurrently clock source 50 drives decoder 54 at a cycle rate which is twice the rate at which decoder 53 is driven. Transistor switches 56-1, 56-2 . . . 56-8, 56-1 . . . are energized the same amount of time as switches 55-1, 55-2 . . . 55-16 are energized. Each of capacitors 74-1, 74-2 . . . 74-16 is connected to the input signal at $f_1$ once for each cycle thereof while each of capacitors 78-1, 78-2 . . . 78-8 is connected to the input signal twice for each cycle thereof. The resulting output signal as applied to differential amplifier 58 is as illustrated in FIG. 2, waveform (b). As before mentioned in connection with FIG. 1, the signals produced by the two commutating filters are subtractively combined in differential amplifier 58 to produce the output signal illustrated in FIG. 2, spectrum (c).

It will be understood that in those cases where only the fundamental frequency $f_1$ is desired, it is possible to connect filter output terminal 78 to a bandpass filter or lowpass filter 90 of relatively poor quality which will remove the odd harmonics thus leaving only the band of frequencies about fundamental frequency $f_1$. In accordance with the prior art, if it were desired to have only frequency $f_1$ then a relatively good bandpass filter would be necessary since it would have to remove both the d.c. component and frequencies in a band at only twice the frequency of the desired fundamental frequency.

What is claimed is:

1. A commutating filter comprising in combination:
   a filter input terminal;
   a filter output terminal;
   a first commutating filter coupled to receive a signal of frequency $f_1$ from said filter input terminal and comprising N storage stages, each having a time constant RC, said first commutating filter having an output terminal at which is presented a first filter output signal;
   a second commutating filter coupled to receive said frequency $f_1$ from said filter input terminal and comprising $N \div 2$ storage stages each having a time constant 2 RC, said second commutating filter having an output terminal at which is presented a second filter output signal;
   first means coupled to said first and second filters to sample said first filter storage stages at $f_1$ and to sample said second filter storage stages at $2f_1$; and
   second means coupled between said output terminals from said first and second commutating filters and said filter output terminal for subtractively combining the filter output signals at said filter output terminal.

2. The combination as set forth in claim 1 wherein said second means comprises a differential amplifier having a non-inverting input terminal, an inverting input terminal and an output terminal which is connected to said filter output terminal, one of said input terminals being coupled to said first filter output terminal and the other input terminal being coupled to said second filter output terminal.

3. The combination as set forth in claim 1 wherein said second means comprises a differential amplifier having a non-inverting input terminal coupled to said first filter output terminal, an inverting input terminal coupled to said second filter output terminal and an output terminal coupled to said filter output terminal.

4. The combination as set forth in claim 1 wherein said first filter comprises a resistor of value $R_1$ coupled to said filter input terminal and N capacitors each of value $C_1$ coupled between said resistor and first means and wherein said second filter comprises a resistor of value $R_2$ coupled to said filter input terminal and $N \div 2$ capacitors each of value $C_2$ coupled between said resistor of value $R_2$ and said first means, wherein the product of $C_2$ and $R_2$ is twice the product of $C_1$ and $R_1$.

5. The combination as set forth in claim 4 wherein said first means comprises N transistorized switches each coupled to a different one of said N capacitors and an additional N/2 transistorized switches each coupled to respective N/2 capacitors and means for serially rendering conductive the N transistorized switches at a frequency $f_1$ and for serially rendering conductive said N/2 transistorized switches at a frequency $2f_1$.

* * * * *